US006911679B1

(12) United States Patent
Vashchenko et al.

(10) Patent No.: US 6,911,679 B1
(45) Date of Patent: Jun. 28, 2005

(54) LVTSCR WITH COMPACT DESIGN

(75) Inventors: Vladislav Vashchenko, Palo Alto, CA (US); Ann Concannon, San Jose, CA (US); Marcel ter Beek, Pleasanton, CA (US); Peter J. Hopper, San Jose, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 10/339,202

(22) Filed: Jan. 9, 2003

(51) Int. Cl.⁷ .............................................. H01L 29/417
(52) U.S. Cl. ...................... 257/122; 257/133; 257/137; 257/355
(58) Field of Search ............................... 257/122, 133, 257/137, 355

(56) References Cited

U.S. PATENT DOCUMENTS

| 5,959,820 | A | * | 9/1999 | Ker et al. ................... 361/111 |
| 6,493,199 | B1 | * | 12/2002 | Su et al. ....................... 361/56 |
| 6,548,868 | B1 | * | 4/2003 | Tsuei et al. ................. 257/355 |
| 2003/0058592 | A1 | * | 3/2003 | Hung et al. .................... 361/56 |

* cited by examiner

*Primary Examiner*—Allan R. Wilson
(74) *Attorney, Agent, or Firm*—Jurgen Vollrath

(57) ABSTRACT

In an ESD protection device making use of a LVTSCR, at least one contacted drain and at least one emitter are formed, and are arranged laterally next to each other to be substantially equidistant from the gate of the LVTSCR, to improve holding voltage and decrease size. The ratio of emitter width to contacted drain width is adjusted to achieve the desired characteristics.

25 Claims, 3 Drawing Sheets

LVTSCR WITH COMPACT DESIGN

FIELD OF THE INVENTION

The invention relates to electrostatic discharge (ESD) protection devices. More particularly, it relates to an improved LVTSCR protection device.

BACKGROUND OF THE INVENTION

Analog circuits typically display sensitivity to excessive voltage levels. Transients, such as electrostatic discharges (ESD) can therefore cause the voltage handling capabilities of the analog circuit to be exceeded, resulting in damage to the analog circuit. In order to protect circuits during ESD events, clamps have been devised to shunt current to ground during excessive voltage peaks.

One of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. Thus, the clamp must be designed so as to be activated below the breakdown voltage of the circuit that is to be protected. At the same time, the latch-up or holding voltage must exceed the normal operating voltage of the protected circuit.

Different protection devices have been developed, each with certain strengths and weaknesses. For instance, grounded gate NMOS devices (GGNMOS) have a high holding voltage but are large and support only limited current densities.

Silicon-controlled rectifiers (SCRs) and low voltage silicon controlled rectifiers (LVTSCRs) on the other hand support higher current densities but suffer from low holding voltage, making them susceptible to latch-up. These characteristics are best understood by considering the double injection process that takes place during the triggering of SCRs and LVTSCRs.

FIG. 1 shows a cross-sectional diagram that illustrates a conventional LVTSCR 100. The LVTSCR 100 has a n-well 112 formed in a p-type material 110. n+ and p+ regions are formed in each of the n-well 112 and the p-material 110. In the case of the n-well well 112 the regions include n+ region 114 and p+ region 116. For the p-material 110, the regions are n+ region 122 and p+ region 124. Furthermore, a n+ (floating drain) region 130 is formed in both material 110 and n-well 112, and a channel region 132 is defined between n+ (source) region 122 and n+ (floating drain) region 130. In addition, LVTSCR 100 includes a gate 136. N+ (source and floating drain) regions 122, 130, and gate 136 define a NMOS transistor 138 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 138 is formed to be identical to the to-be-protected MOS transistors, the junction between n+ region 130 and material 110 breaks down at the same time that the to-be-protected MOS transistors experience junction breakdown, thereby preventing destructive breakdown of the MOS transistors that are being protected.

In operation, when the voltage across node 120 (low voltage node) and 126 (high voltage node) is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 10 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

This is injection of both holes and electrons is referred to as double injection and provides current densities (after snapback) that are about ten times greater than the densities provided by a grounded-gate MOS device. Since junction break down occurs before the MOS transistors experience destructive gate oxide break down, LVTSCR 100 turns on before destructive gate oxide breakdown occurs, thereby protecting the MOS transistors. Thus, the junction breakdown voltage, which is less than the voltage level that causes destructive gate oxide breakdown, functions as the trigger voltage.

However, as mentioned above, one disadvantage of LVTSCR 100, and, for that matter, any SCR is that it suffers from a holding voltage that is often less than the minimum (or latch-up) voltage of the ESD protection window. The low holding voltage of the LVTSCR which lies in the range of less than two volts, is due to the double junction injection of its conductivity modulation mechanism. While the p+ emitter allows one to define how many holes are injected, the injection of the holes leads to greater space charge neutralization and thus a lower holding voltage. This creates a problem when seeking to protect circuits that are biased above a certain voltage, such as circuits biased above 2V, since it causes latch-up in the LVTSCR.

Furthermore, the LVTSCR is limited in its use as a self-protection device since the through n-well connection between the contacted drain region 114 and the floating drain 130 displays unacceptably high n-well resistance for normal operation, causing reduced saturation current What is needed is a compact solution to the problem wherein the LVTSCR has a higher holding voltage characteristic.

SUMMARY OF THE INVENTION

The present invention provides an LVTSCR-like structure having a controllable, high holding voltage and a lower parasitic capacitance.

For ease of reference, in order to distinguish the floating drain from the non-floating drain that has a contact, the latter is referred to herein as the contacted drain.

According to the invention, there is provided an ESD protection structure, comprising a gate, at least one contacted drain region, at least one emitter region and at least one floating drain region in which the at least one contacted drain region and emitter region are located adjacent to each other, substantially equidistant from the gate. Typically the at least one contacted drain region is a n+ region, and the at least one contacted emitter region is a p+ region. The structure may include a plurality of contacted drain regions and emitter regions arranged laterally in alternating fashion.

Further, according to the invention there is provided a LVTSCR structure having at least one contacted drain region and at least one emitter region arranged next to each other. The LVTSCR structure may include a plurality of contacted drain regions and emitter regions arranged laterally in alternating fashion.

Still further, according to the invention, there is provided a method of reducing the n-well junction capacitance of a LVTSCR, comprising providing at least one contacted drain and at least one emitter, and arranging the at least one contacted drain and at least one emitter laterally next to each other. The drain may be a n+ region and the emitter may be a p+ region arranged substantially equidistant from the gate. The faces of the n+ drain and p+ emitter closest to the gate may be substantially equidistant from the gate.

Still further, according to the invention, there is provided a method of reducing the drain resistance of an LVTSCR by providing at least one contacted drain and at least one emitter, and arranging the at least one contacted drain and at least one emitter laterally next to each other.

Still further, according to the invention, there is provided a method of reducing the size of a LVTSCR by providing at least one contacted drain and at least one emitter, and arranging the at least one contacted drain and at least one emitter laterally next to each other.

Still further according to the invention, there is provided a method of improving at least one of the characteristics of a LVTSCR ESD protection structure, comprising providing at least one contacted drain and at least one emitter, and arranging the at least one contacted drain and at least one emitter laterally next to each other. The characteristics improved may include at least one of increased holding voltage, reduced n-well junction capacitance, and reduced drain resistance. The method may include adjusting the at least one characteristic by adjusting the width or area of at least one of, the contacted drain, and the emitter. The emitter is typically a p+ region, and the characteristic may be changed by increasing the width or the area of the emitter over that of the n+ drain. Instead, the emitter width may be reduced to where it is less than the contacted drain width. Preferably the ratio of p+ emitter width to n+ drain width is 60/40. Preferably the width of the emitter is less than 0.85 $\mu$m. Relative emitter/drain sizes of 0.91 $\mu$m/0.6 $\mu$m and 1.2 $\mu$m/0.8 $\mu$m may also be used. Preferably a plurality of p+ emitters and n+ drains are formed to handle the high current requirements of an ESD event, while keeping the sizes of the p+ emitter and n+ drain small.

DETAILED DESCRIPTION OF THE INVENTION

Figure 1:
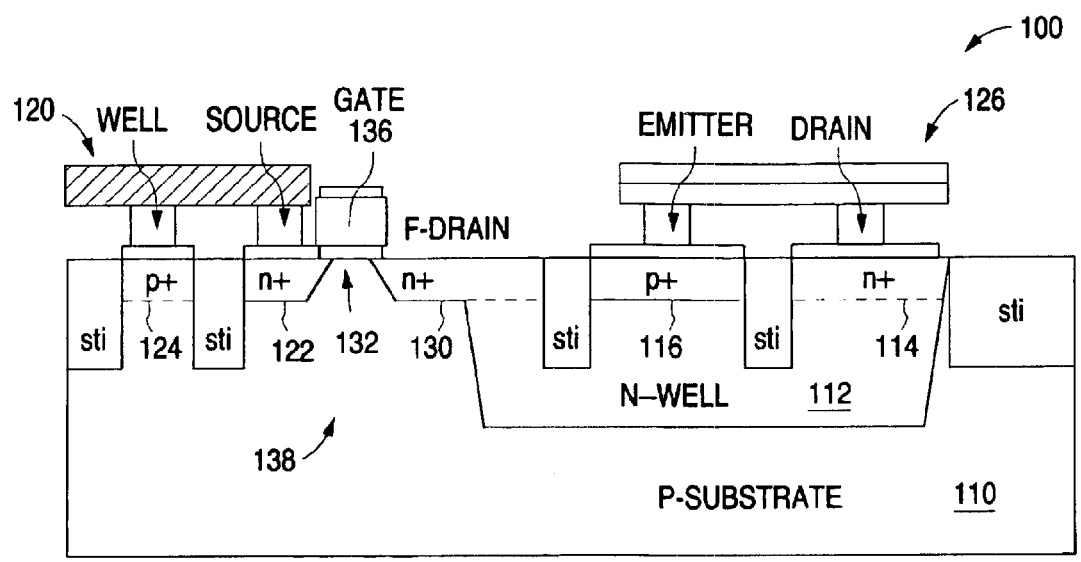
FIG. 1 is a cross-sectional view illustrating a conventional LVTSCR.
Figure 2:
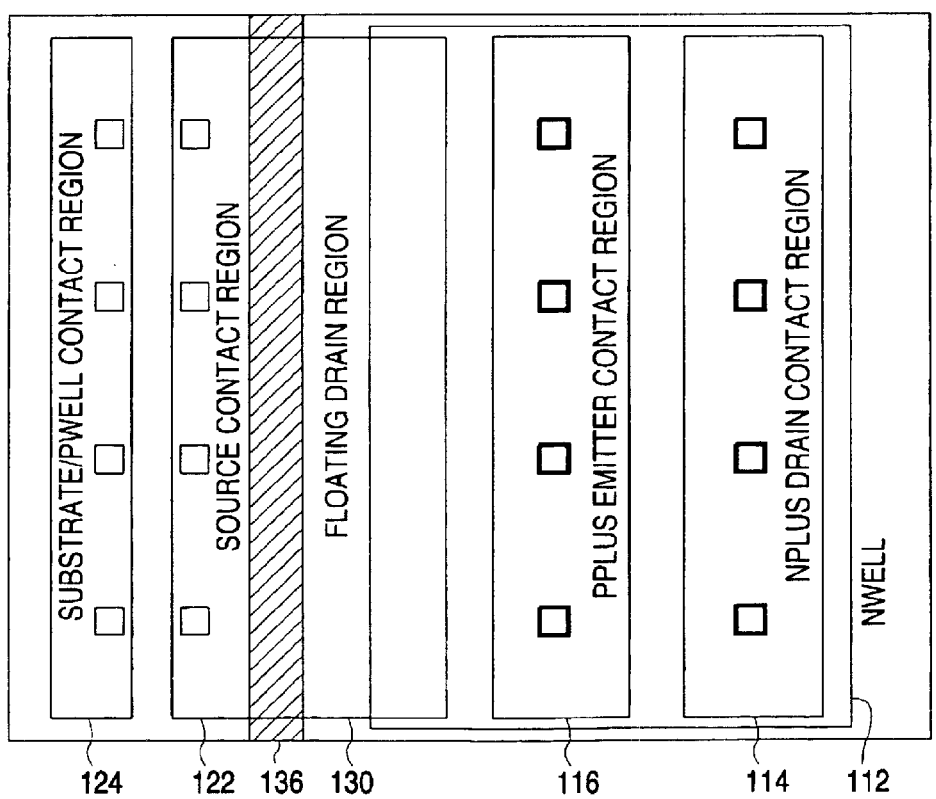
FIG. 2 is a plan view of the device of FIG. 1.

Referring again to the sectional view of a LVTSCR 100 as shown in FIG. 1, and the plan view of the LVTSCR 100 shown in FIG. 2, it can be seen that the contacted drain 114 and emitter 116 are formed behind each other with the emitter 116 located between the drain 114 and the gate 136.

Figure 3:
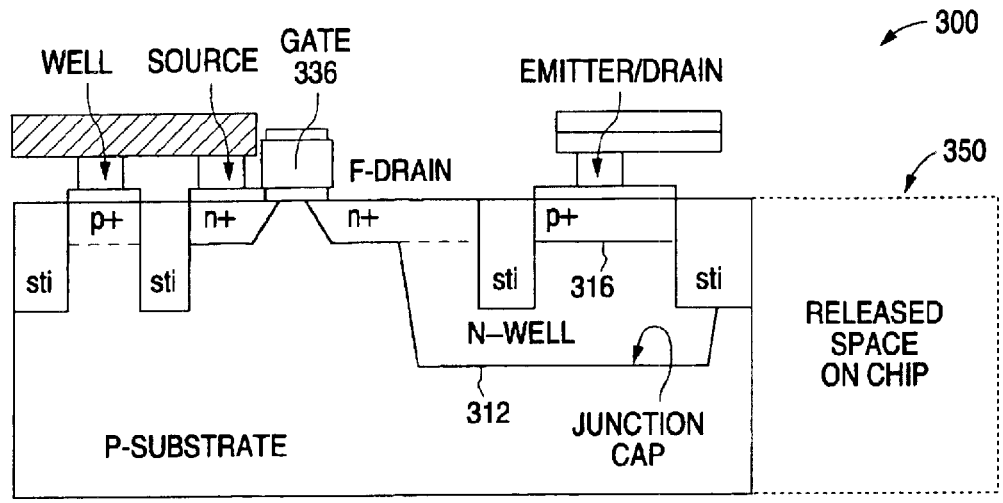
FIG. 3 is a cross-sectional view of one embodiment of a snapback structure of the invention.
Figure 4:
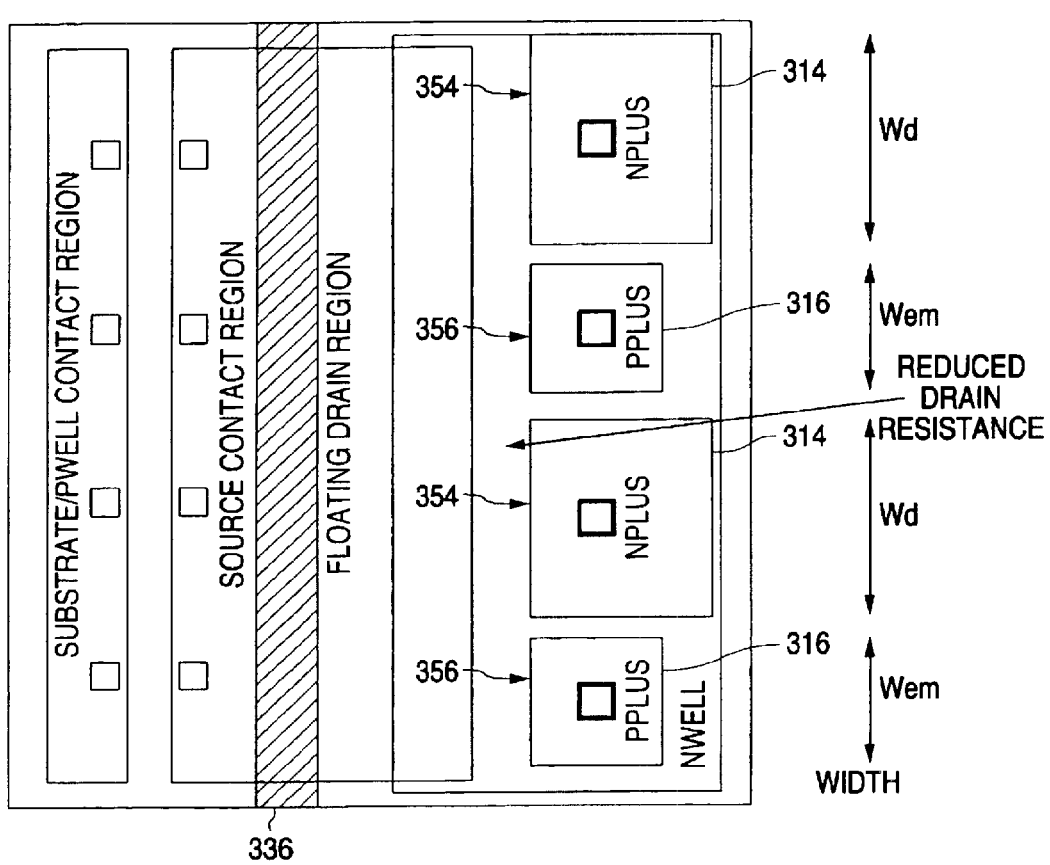
FIG. 4 is a plan view of the structure of FIG. 3.

FIGS. 3 and 4, in contrast, show one embodiment of the invention. The structure 300 is shown in cross-section in FIG. 3, and in plan view in FIG. 4. As is evident from FIGS. 3 and 4, the contacted drain is formed as a plurality of separate contact drains 314 of relatively small width Wd. The emitter is, in turn, formed as a plurality of separate emitters 316 of relatively small width Wem. In the embodiment shown, the contacted drains 314 are wider than the emitters 316 but the faces 354, 356 of the contacted drains 314 and emitters 316, respectively, that are closest to the gate 336, are substantially equidistant from the gate 336. In other embodiments the widths Wd of the contacted drains 314 and the widths Wem of the emitters 316, were adjusted so that. Wd was smaller than Wem. In fact, since the p+ emitter determines the injection of carriers in the LVTSCR structure, typically it is desirable to keep the p+ emitters 316 larger than the n+ drain 314. However, it will also be appreciated that since the LVTSCR characteristics of the present device 300 are dictated largely by the double injection capabilities provided by the p+ emitter, the n+ drain regions 314 should not be too small since they determine the NMOS characteristics achieved in the LVTSCR structure 300. One embodiment found to work well involved a ratio of 60/40 in which 60% of the total width Wd+Wem of each pair of p+ emitters 316 and contacted n+ drains 314 was taken up by the p+ emitter. Preferably the width of the emitter is less than 0.85 $\mu$m. Relative emitter/drain sizes of 0.9 $\mu$m/0.6 $\mu$m and even 1.2 $\mu$m/0.8 $\mu$m were, however, also found to work.

While the above embodiment involved adjusting the relative widths of the p+ emitters 316 and contacted n+ drains 314, in another embodiment the ratios of the areas of these two regions were adjusted instead.

In yet another embodiment, the relative positions of the contacted drains 314 and emitters 316 were adjusted so that their central axes were substantially equidistant from the gate.

While the embodiment shown in FIGS. 3 and 4 shows multiple contacted drains and emitters, the invention can also be implemented with only one contacted drain and one emitter arranged laterally next to each other. However, in order to achieve a LVTSCR with high holding characteristics, a single p+ emitter and n+ drain pair would typically be for low power applications. For ESD protection, it must be borne in mind that the total structure width for adequate ESD protection typically has to be in the range of 50–150 $\mu$m. This would require very large n+ drain and p+ emitter next to each other. In order to take into account the three dimensional nature of the device and avoid it behaving like a separate NMOS in parallel with a LVTSCR, it is desirable to limit the sizes of the n+ drains 314 and p+ emitters 316 and use multiple drain/emitter pairs instead. (A simple NMOS in parallel with a conventional LVTSCR would produce triggering characteristics that are much the same as either of the devices on their own but the NMOS would display a much higher holding voltage that the LVTSCR. Thus the LVTSCR would remain latched up after triggering. Thus the sizes of the emitters 316, and drains 314 in each emitter/drain pair is preferably kept small enough. As mentioned above, an emitter size of 0.85 $\mu$m was found to work well. However, experiments with relative emitter/drain sizes of 0.9 $\mu$m/0.6 $\mu$m and even 1.2 $\mu$m/0.8 $\mu$m were still found to work adequately.

However, in another embodiment, a single n+ drain/p+ emitter structure was tested for ESD events and found to be useful for certain applications. Using a small SCR (small p+ emitter) with its high dV/dt effect served to trigger a large NMOS, thereby providing for faster triggering of large NMOS devices.

Figure 5:
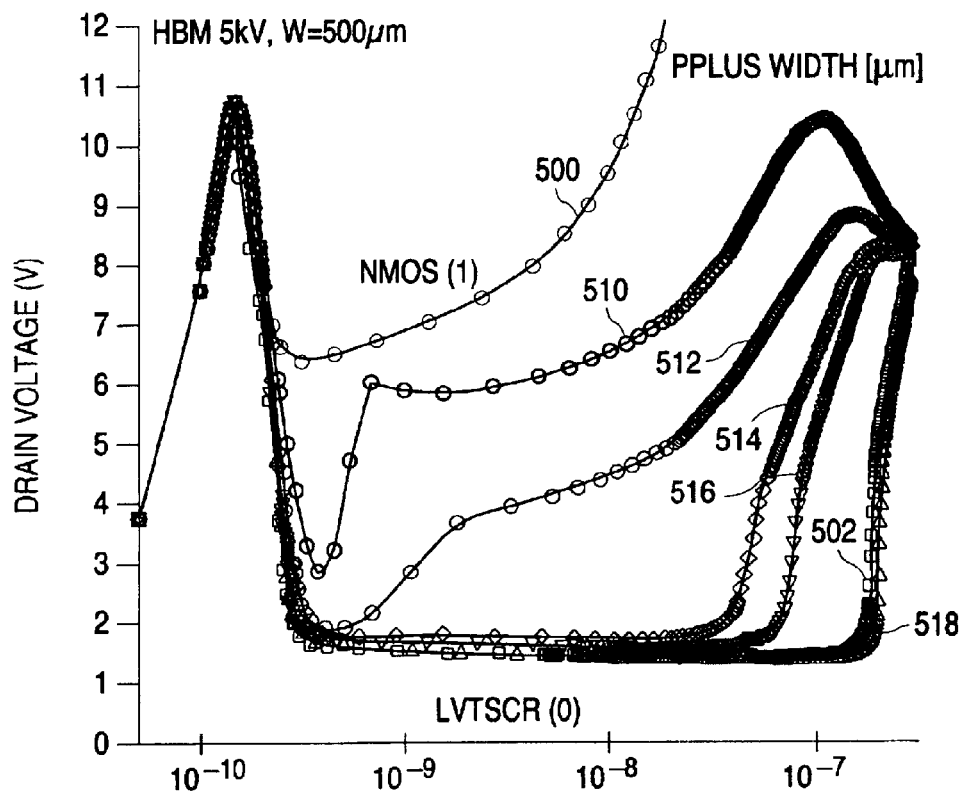
FIG. 5 shows various graphs showing drain voltage changing over time for various p+ region widths for embodiments of the invention and for a conventional LVTSCR and a conventional NMOS device.

Generally speaking, simulation results have shown that the present invention provides a marked improvement over conventional LVTSCRs in many of the characteristics. For instance, the present invention showed increased holding voltage, reduced n-well junction capacitance, and reduced drain resistance compared to conventional LVTSCRs. The extent of the change in these characteristics depended on the dimensions of the contacted drains 314 and emitters 316. FIG. 5 shows graphs of drain voltage changes over time for various embodiments of the invention compared to a conventional LVTSCR and a conventional grounded gate NMOS (GGNMOS) device. Curve 500 shows the characteristics of a NMOS device, while curve 502 shows the characteristics of a conventional LVTSCR. Curves 510, 512, 514, 516, 518 show the characteristics for embodiments of the invention with emitter widths Wem of 0.25 $\mu$m, 0.35 $\mu$m, 0.5 $\mu$m, 0.6 $\mu$m, and 0.85 $\mu$m, respectively. As is evident from the curves, the holding voltage increases as the emitter width Wem decreases. In fact, the results show that it is preferable to keep the emitter size below 0.85 $\mu$m width, since the characteristics approach those of a conventional LVTSCR above that width. Marked improvements in holding voltage are evident at smaller emitter widths.

Also, by arranging the individual contacted drains and emitters laterally next to each other, as can be seen in FIG. 4, a large amount of chip space is saved. This is indicated by reference numeral 350 in FIG. 3. Since the n-well 312 is thus reduced in length, the drain resistance and n-well capacitance are reduced. This has the effect of reducing the on-state resistance, making the device more suitable for normal operation and thus for use in a self-protection application. Also, the lower capacitance allows the device to operate effectively at higher frequencies. It will be appreciated that the reduced size of the device can significantly reduce costs by saving valuable real estate on a chip. Furthermore, the present invention allows holding voltage to easily be adjusted by adjusting the widths of one or both of the contacted drains and the emitters.

Figure 6:
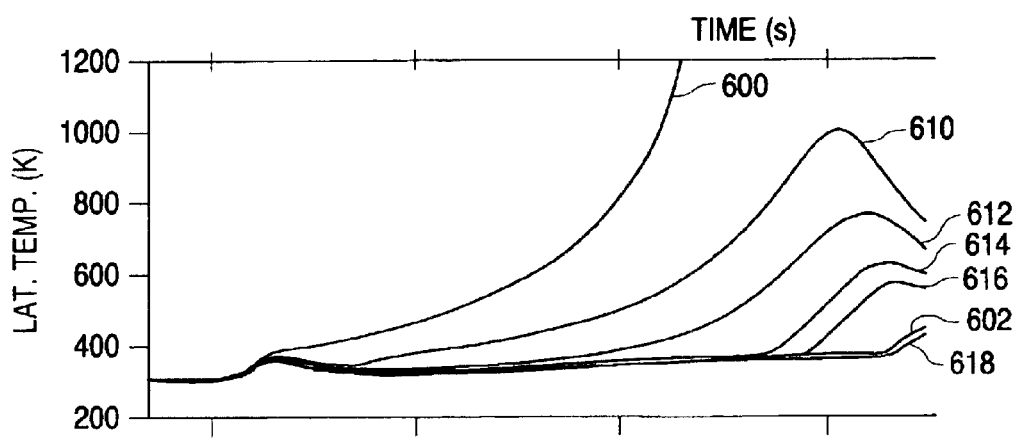
FIG. 6 shows graphs of lattice temperature changing over time for the devices depicted in FIG. 5.

FIG. 6 shows lattice temperature variations over time for a conventional GGNMOS device (curve 600), a conventional LVTSCR (curve 602), and devices of the invention with emitter width Wem of 0.25 $\mu$m, 0.35 $\mu$m, 0.5 $\mu$m, 0.6 $\mu$m (curves 510, 512, 514, 516, 518, respectively). As can be seen, although the lattice temperature increases as the width of the emitters is reduced, it is nevertheless lower than for a GGNMOS. Even the 0.25 $\mu$m emitter width embodiment shows a significantly lower lattice temperature.

While specific embodiments were discussed, it will be appreciated that different embodiments of the invention can be implemented without departing from the scope of the invention as defined in the claims.

What is claimed is:

1. An ESD protection structure, comprising
   a gate,
   at least one contacted drain region,
   at least one emitter region, and
   at least one floating drain region, wherein the at least one contacted drain region and at least one emitter region are located next to each other in a direction along the width of the gate.

2. A structure of claim 1, wherein the at least one contacted drain region and at least one emitter region are substantially equidistant from the gate.

3. A structure of claim 1, wherein the at least one contacted drain region is a n+ region, and the at least one emitter region is a p+ region.

4. A structure of claim 1, wherein the structure includes a plurality of contacted drain regions and emitter regions arranged along the gate in alternating fashion.

5. A structure of claim 1 wherein the ratio of emitter region width to contacted drain region width is approximately 60 to 40.

6. A structure of claim 1 wherein the ratio of emitter region area to contacted drain region area is approximately 60 to 40.

7. A structure of claim 5, wherein the width of the emitter region is less than 0.85 $\mu$m.

8. A LVTSCR structure having a gate, at least one contacted drain region and at least one emitter region arranged next to each other in a direction along the width of the gate.

9. A LVTSCR structure of claim 8, wherein the structure includes a plurality of contacted drain regions and emitter regions arranged along the gate in alternating fashion.

10. A structure of claim 8 wherein the ratio of emitter region width or area to contacted drain region width or area is approximately 60 to 40.

11. A structure of claim 10, wherein the width of the emitter region is less than 0.85 μm.

12. A method of reducing the n-well junction capacitance of a LVTSCR, comprising providing at least one contacted drain, providing at least one emitter, providing a gate, and arranging the at least one contacted drain and the at least one emitter next to each other in a direction along the width of the gate.

13. A method of claim 12, wherein the at least one contacted drain is formed as a n+ region and the at least one emitter is formed as a p+ region, and the contacted drain and emitter are arranged substantially equidistant from the gate.

14. A method of claim 13, wherein the contacted drain and emitter are formed such that the faces of the contacted drain and emitter closest to the gate are substantially equidistant from the gate.

15. A method of reducing the drain resistance of a LVTSCR, comprising providing at least one contacted drain, providing at least one emitter, and arranging the at least one contacted drain and the at least one emitter next to each other in a direction along the width of the gate.

16. A method of reducing the size of a LVTSCR, comprising providing at least one contacted drain, providing at least one emitter, and arranging the at least one contacted drain and the at least one emitter next to each other in a direction along the width of the gate.

17. A method of improving at least one of the characteristics of a LVTSCR ESD protection structure, comprising providing at least one contacted drain, providing at least one emitter, and arranging the at least one contacted drain and the at least one emitter next to each other in a direction along the width of the gate.

18. A method of claim 17, wherein the characteristics improved include at least one of, increased holding voltage, reduced n-well junction capacitance, and reduced drain resistance.

19. A method of claim 18, wherein the method includes adjusting the at least one characteristic by adjusting the width or the area of at least one of, the contacted drain, and the emitter.

20. A method of claim 19, wherein the emitter is formed as a p+ region, and the characteristic is improved by reducing the width or the area of the emitter.

21. A method of claim 20, wherein the width of the emitter is reduced to less than 0.85 μm.

22. A method of claim 20, wherein the emitter width or area is reduced to where it is less than the contacted drain width.

23. A method of claim 19, wherein the contacted drain width or area is reduced to where it is less than the emitter width.

24. A method of claim 23, wherein the ratio of emitter width to contacted drain width is approximately 60 to 40.

25. A method of claim 20, wherein the width of the emitter is reduced to less than 0.85 μm.

* * * * *